(12) United States Patent
Upschulte et al.

(10) Patent No.: US 6,472,869 B1
(45) Date of Patent: Oct. 29, 2002

(54) DIODE LASER-PUMPED MAGNETOMETER

(75) Inventors: Bernard L. Upschulte, Nashua, NH (US); Steven J. Davis, Londonderry, NH (US); Ludwig C. Balling, Lee, NH (US); John J. Wright, Nottingham, NH (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/883,166

(22) Filed: Jun. 18, 2001

(51) Int. Cl.[7] .................................................. G01V 3/00
(52) U.S. Cl. ........................ 324/304; 324/301; 324/300
(58) Field of Search ................................ 324/304, 301, 324/305, 302, 300; 359/341

(56) References Cited

U.S. PATENT DOCUMENTS

| | | | | |
|---|---|---|---|---|
| 3,750,008 A | * | 7/1973 | Asano et al. ................ | 324/5 R |
| 4,806,864 A | * | 2/1989 | Schearer et al. ............. | 324/301 |
| 5,436,561 A | * | 7/1995 | Leger ........................... | 324/301 |
| 5,493,223 A | * | 2/1996 | Leger ........................... | 324/304 |
| 5,602,475 A | * | 2/1997 | Bohler ......................... | 324/301 |

\* cited by examiner

*Primary Examiner*—Edward Lefkowitz
*Assistant Examiner*—Brij B. Shrivastav
(74) *Attorney, Agent, or Firm*—William G. Auton

(57) ABSTRACT

A diode laser-pumped magnetometer includes a diode laser that emits a polarized pumping laser beam with resonant optical radiation; and a K-cell through which a magnetic field is manifested from an independent source, the K-cell containing atoms with a dipole experiencing a torque due to the magnetic field. The atoms are excited by the resonant optical radiation of the pumping laser beam and periodically emitting a response radiation as they return to ground state such that the response radiation includes photons that indicate one unit of angular momentum indicative of the torque due to the magnetic field. Finally, a photodetector serves as a means for measuring the response radiation of the K-cell to indicate thereby a measure of the magnetic field in the K-cell from the independent magnetic source.

3 Claims, 12 Drawing Sheets

DIODE LASER-PUMPED MAGNETOMETER

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to lasers and more specifically to a diode laser-pumped magnetometer. Magnetometers have many applications in a variety of commercial, research, and military areas. The range of scale sizes of magnetic mapping is very large. An example of a small scale application might be for non-destructive evaluation of a weld in a nuclear reactor containment shield. Large scale application would include mapping the earth's magnetosphere, or surveying for offshore oil reserves. Particularly interesting opportunities for magnetometers include: sensors for medical or biomagnetic brain cortex imaging, sensors for detection of underground weapons production facilities, and sensors for extremely low frequency (ELF) communication receivers. Development of more sensitive, faster sampling, vibration tolerant magnetometers will benefit all application.

The task of producing a diode laser-pumped magnetometer is alleviated, to some extent by the systems disclosed in the following U.S. Patents, the disclosures of which are incorporated herein by reference:

U.S. Pat. No. 3,750,008, Jul. 31, 1973, Optical pumping magnetometer, Asano, Hiroshi, U.S. Pat. No. 3,652,926, Mar. 28, 1972, Optical pumping magnetometers, Brun, Henri, U.S. Pat. No. 5,602,475, Feb. 11, 1977, Laser pumped magnetometer, Bohler, Christopher, U.S. Pat. No. 5,493,223, Feb. 20, 1996, Resonance magnetometer with optical pumping using a monolithic laser, Leger, Jean-Michel, U.S. Pat. No. 4,806,864, Feb. 21, 1989, Laser-pumped helium magnetometer, Schearer.

The primary goal of this invention was to demonstrate the feasibility of using a miniature diode laser as a pump source for optically pumped magnetic resonance alkali vapor magnetometers. As we show later, we were successful in these demonstrations, and our Phase I results indicate that diode laser pumped alkali magnetometers will have significant advantages over conventional magnetometers. First we note that in general, optically pumped magnetometers (OPM) have several advantages over magnetic flux magnetometers. Optically pumped alkali magnetometers are:

Essentially unaffected by the direction of the magnetic field,

Inherently insensitive to vehicle or platform vibration,

Capable of long baseline normalization.

In particular, a fiber-optic coupled diode laser magnetometer offers numerous significant improvements over current instruments relying on discharge resonance lamps.

a) Vapor cells can be made smaller for laser instruments. This translates into better sensitivity because the uniformity of the magnetic field is typically higher over small scale sizes.

b) Smaller vapor cells require smaller rf coils reducing rf field inhomogeneities which may translate into narrower resonance linewidths, better sensitivity, and smaller dead zone angles.

c) The additional light intensity available with diode lasers may generate enhanced polarization in the atomic vapor and this may generate an order of magnitude increase in magnetometer sensitivity.

d) Because fiber optics are non-magnetic, a fiber optic coupled device allows flexible location of the instrument without magnetic interferences. For example the diode laser could be concurrently located in the body of the aircraft and utilize a fiber to deliver the light to several magnetometer sensor heads in a tether unit or at the aircraft wing tip. Fiber optic bifurcation and splitting, even tenfold, is now routine.

e) Resonance lamps are not easily or efficiently coupled to fiber optics due to the optical divergence of the lamp light. The low divergence beam of a diode laser easily couples to fiber optics and could provide sufficient light intensity to operate many magnetometers simultaneously.

f) Fiber optic diode laser technology has the potential to be battery operated at room temperature, miniaturized, and ruggedized for development of a covert magnetometer package. Existing SQUID devices require cryogen to be replaced every few days, and small resonance lamp magnetometers are inefficient power consumers.

SUMMARY OF THE INVENTION

The present invention includes a diode laser-pumped magnetometer made up of a diode laser, K-cell, and photo sensor. The diode laser emits a polarized pumping laser beam with resonant optical radiation. This pumping laser beam is sent to a K-cell through which a magnetic field is manifested from an independent source. The K-cell contains atoms with a dipole experiencing a torque due to the magnetic field. These atoms are excited by the resonant optical radiation of the pumping laser beam and periodically emitting a response radiation as they return to ground state such that the response radiation includes photons that indicate one unit of angular momentum indicative of the torque due to the magnetic field; and Finally a photodiode and scope act as a means for measuring the response radiation of the K-cell to indicate thereby a measure of the magnetic field in the K-cell from the independent magnetic source.

DETAILED DESCRIPTION OF THE PREFERRED EMBODIMENT

Figure 1:
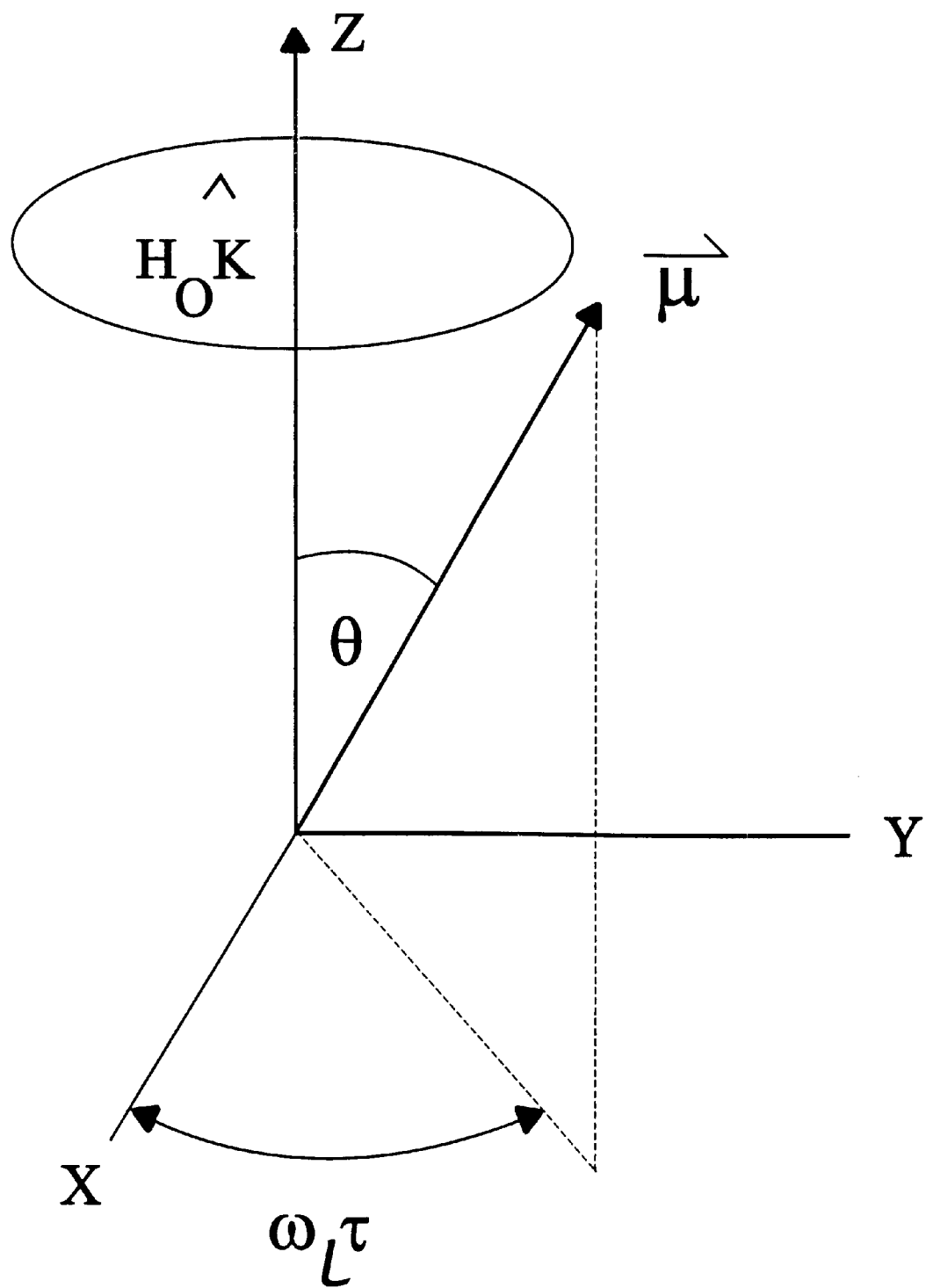
FIG. 1 is an illustration of the Classical Model of Atomic Magnetometer.

The present invention is a diode laser-pumped magnetometer. The basic concept behind atomic magnetometers can be illustrated with a simple, semi-classical model as indicated in FIG. 1. Here we show an atomic magnetic dipole $\mu$ in a static magnetic field, $H_0$k is k is a unit vector in the z direction. The dipole will experience a torque $\tau$ due to the magnetic field. However, since the torque is the rate of change in the direction of the angular momentum, hdJ/dt, we can write:

$$h\, dJ/dt = \mu \times H_0 k \quad (1)$$

We recognize that $\mu = \gamma hM$, where $\gamma = g\mu_B/h$ is the gyromagnetic ratio $$d\mu/dt = \gamma \mu \times H_0 k \quad (2)$$

The solutions for the three components of $\mu$ are given by:

$$\mu_x = \mu \sin\theta \cos\omega_L t \quad (3)$$

$$\mu_y = \mu \sin\theta \sin\omega_L t \quad (4)$$

$$\mu_z = \mu \cos\theta \quad (5)$$

These are the equations of a precessing magnetic dipole in a static magnetic field. The precession frequency is called the Larmor frequency, $\omega_L$, and is directly proportional to the magnitude of the magnetic field:

$$\omega_L = \gamma H_0 \quad (6)$$

Thus, if we can measure the Larmor frequency, then we can determine the magnitude of the static field since $\gamma$ is known. From Eqs. (4) and (5) we see that if we can observe the temporal evolution of $\mu_x$ and/or $\mu_y$ then we can measure the Larmor frequency. This is the basis of atomic alkali magnetometers. Optical pumping is used to prepare and monitor the alkali atom dipoles so that the Larmor frequency can be measured.

Energy shifts due to $H_0$ are given by Eq. (7):

$$E = g_j \beta H_0 m_j \quad (7)$$

where $g_j$ is the Lande factor, and $\beta$ is the Bohr magneton.

From Eq. (7) we see that the splitting varies linearly with the strength of the magnetic field for weak fields. We discuss the splitting in more detail below.

When resonant, $D_1$ radiation connecting the $S_{1/2}$ level to the $P_{1/2}$ level is incident on the cell, atoms will be pumped to the $P_{1/2}$ level. Once in the excited state the atoms radiate back to the ground state. When the pump radiation is circularly polarized, each photon carries one unit of angular momentum. If the excitation radiation is left circularly polarized, each absorbed photon will induce a change $+m_j$ in the atom. Thus only the $m_j = -\frac{1}{2}$ can absorb. Since re-radiation from the excited P state populates both the magnetic sub levels of the S state there is a buildup of population in the $m_j = \frac{1}{2}$ level since the $m_j = \frac{1}{2}$ level cannot absorb the circularly polarized pump photon. For the limiting case of all the population in this level the cell becomes transparent to the resonance radiation. The actual ratio of the population of the pumped $m_j$ level depends upon both the excitation rate by the pump source and the relaxation rates of the $m_j$ levels. For example, collisions with the cell walls or with buffer gases can remove population from $m_j = \frac{1}{2}$. Note that collisions with uncoated cell walls are the most efficient at removing population from the pumped sublevel. Population can also be transferred from $m_j = -\frac{1}{2}$ to the $m_j = +\frac{1}{2}$ state via gas phase collisions.

Note that the $D_2$ radiation connects the $S_{1/2}$ state to the $P_{3/2}$ state will decrease the selective population of $m_j = +\frac{1}{2}$ since it can then absorb the circularly polarized pump photon to the $m_j = \frac{3}{2}$ level in $P_{3/2}$ state. Typically the $D_2$ line is filtered out from the pump radiation using a narrow band filter that transmits only the $D_1$ line. Our tunable diode laser approach allows us to selectively pump only on the $D_1$, and we do not consider the $D_2$ line further.

The pumping process described above gives rise to a macroscopic magnetization of the atomic ensemble contained in the cell. This is known as "orientation". If one uses unpolarized light, a linear combination of right and left circularly polarized light, both $m_j$ will be populated and the atomic system will be "aligned". From here on we will focus on orientation using circularly polarized resonance radiation.

Figure 2:
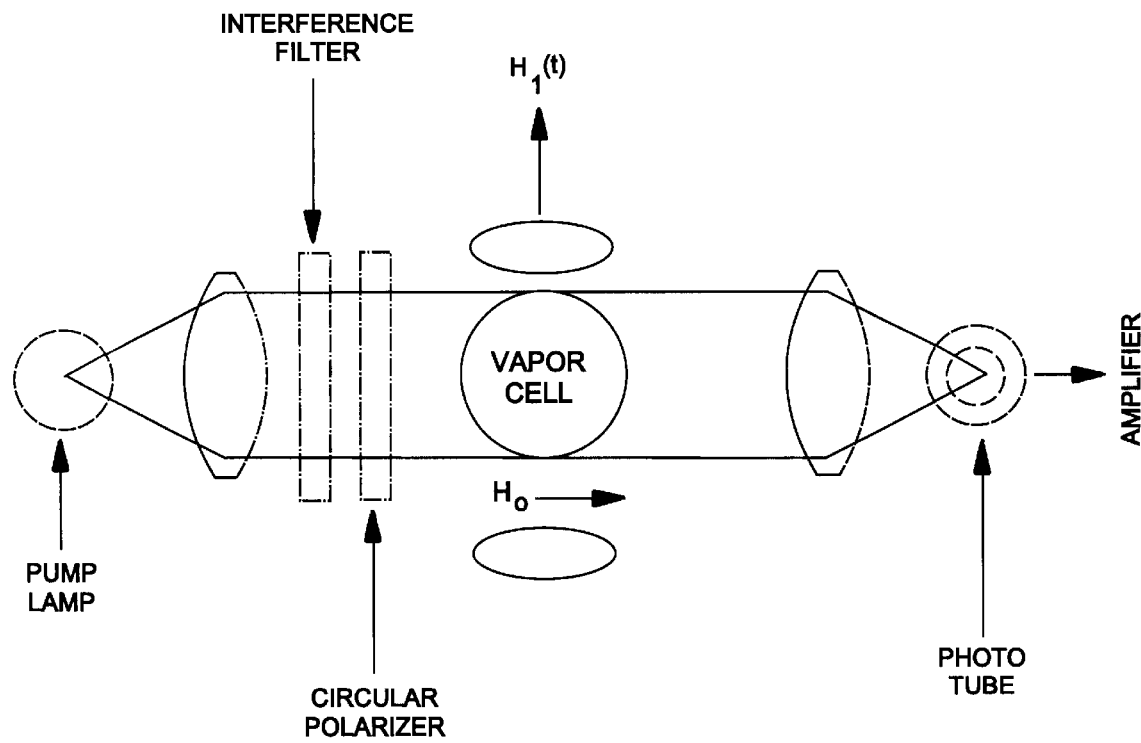
FIG. 2 shows typical setup of Ground State Optical Pumping experiment.

As we mentioned above, the degree of optical pumping can be inferred by observation of the fraction of the pump resonance light that is transmitted through the cell. A simple photodetector placed after the cell (see FIG. 2) will supply this information. When the cell is first subjected to the pump radiation the absorption is strong and as pumping proceeds the transmission becomes much higher. The extreme sensitivity of optical pumping techniques is due in large measure to the high sensitivity of the detection of the transmitted pump beam. The absorption cross sections for alkali $D_1$, radiation are very large, on the order of $(2-5) \times 10^{-12} cm^2$. Typically, optical pumping cells are run with an alkali number density of approximately $3 \times 10^{11}$ atoms $cm^3$. For a 2 cm path length the initial absorption can be greater than 10%.

An oscillating magnetic field perpendicular to the steady field, $H_0$, will induce transition between the Zeeman levels with the selection rule $\Delta m_j = \pm 1$ if the frequency ($\upsilon_1$) of the oscillating field matches the energy separation of adjacent Zeeeman levels:

$$h\upsilon_1 = g\beta H_0.$$

Figure 3:
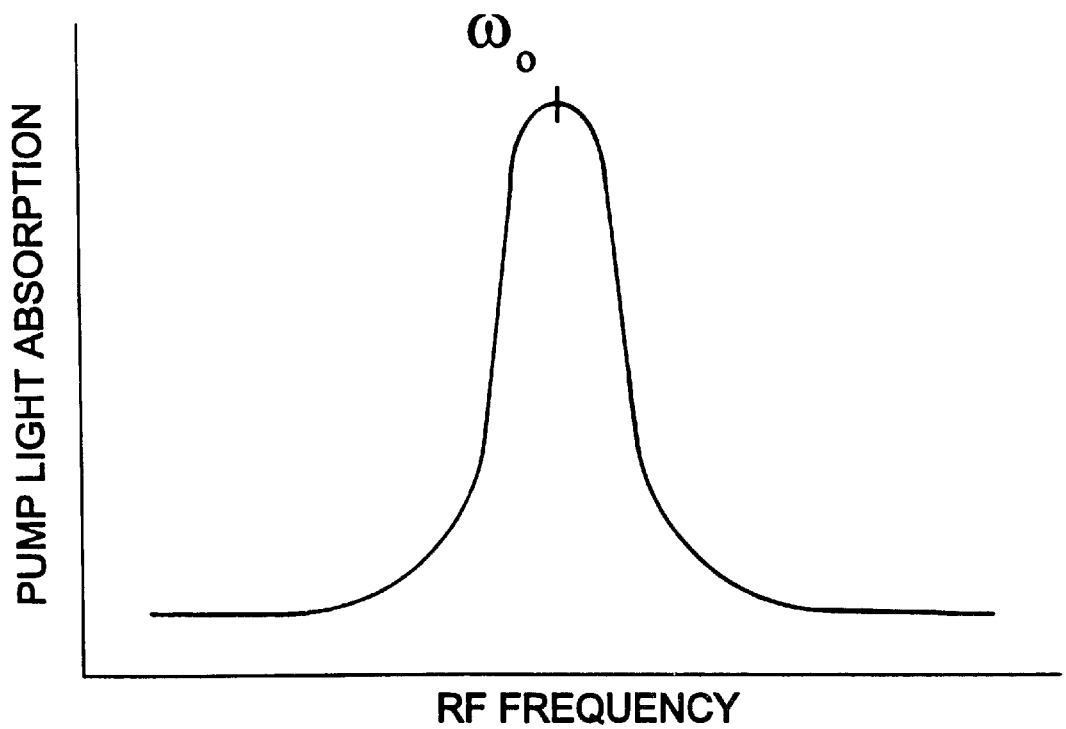
FIG. 3 is a chart showing detection of Zeeman resonances by absorption of pump light.
Figure 4:
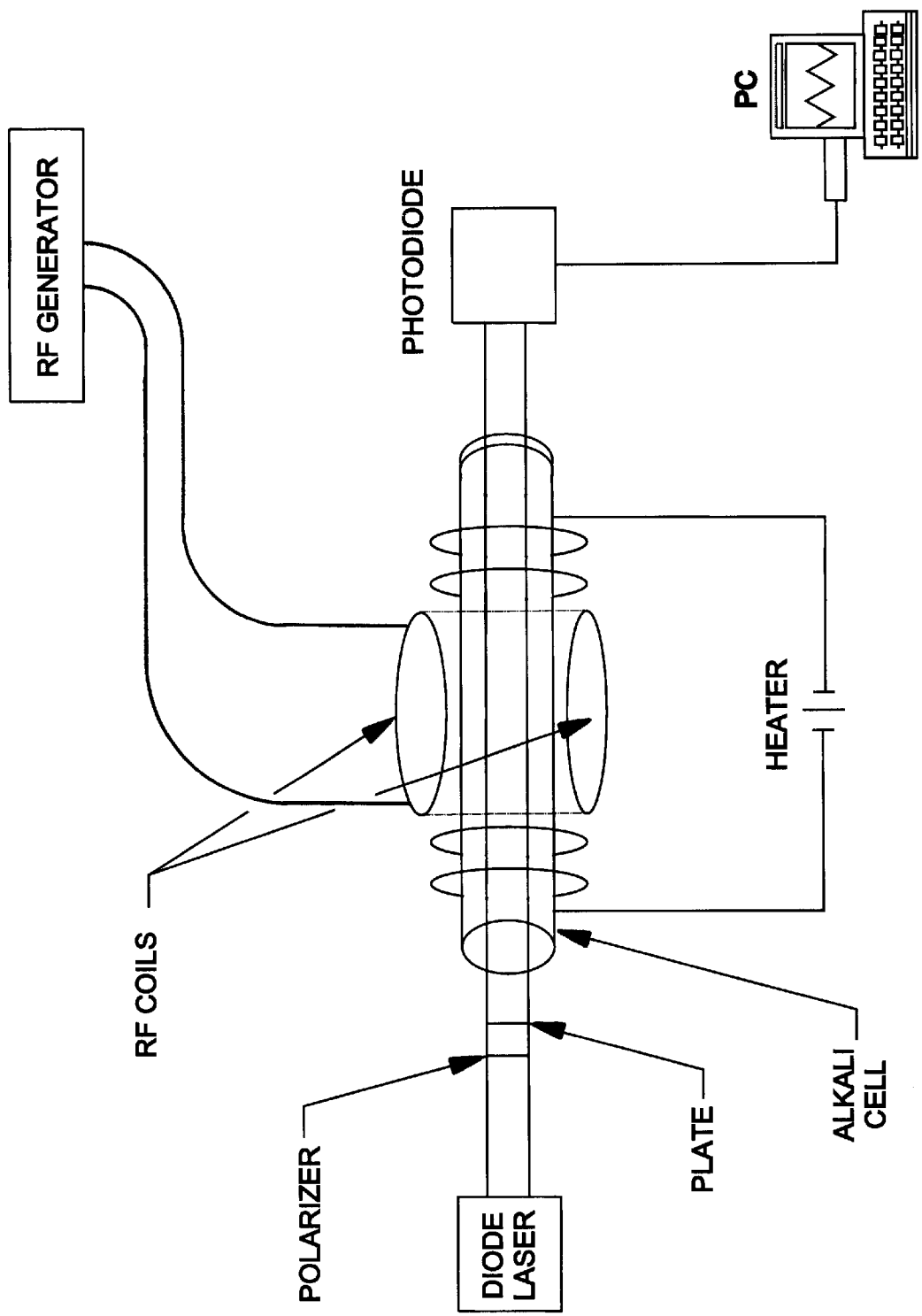
FIG. 4 is an illustration of the preliminary PSI longitude optical pumping setup.

When this rf field is applied, the macroscopic polarization in the z direction changes and this change is readily detected as a change in the intensity of the transmitted light. In FIG. 3 we show a typical trace of transmitted pump light as the rf frequency is scanned through a Zeeman resonance.

Previous atomic magnetometers have been pumped into discharge resonance lamps. In the invention we have used a miniature diode laser to replace the resonance lamp. Preliminary optical pumping and magnetometer tests were performed on both Rb and K at PSI. As discussed earlier, optical pumping of alkali vapor requires circularly polarized light. The diode laser output is typically linearly polarized, and was further polarized by passing the laser beam through a Polarcor linear polarizing element. The laser polarization and "Polarcor" element were aligned by maximizing the transmitted light intensity to the power meter. The laser light was circularly polarized by adding a zero-order quartz quarter wave retardation plate after the Polarcor plate.

A double resonance experiment was performed again using a longitudinal mode experimental setup shown in FIG.

4. In this experiment we added two loops of copper wire transverse to the optical pumping axis to serve as a rf coil. The diode laser wavelength was not scanned in these experiments. Rather, it was set to the wavelength at the peak of the absorption line. The rf coil was attached to the HP 33120A Function Generator that served as the rf source. At the magnetic resonance frequency, some of the atomic vapor stored in Zeeman levels that are incapable of absorbing the angular momentum of the circularly polarized light was induced into Zeeman levels that can absorb the light, and laser absorption was detected by the Si photodiode.

Figure 5:
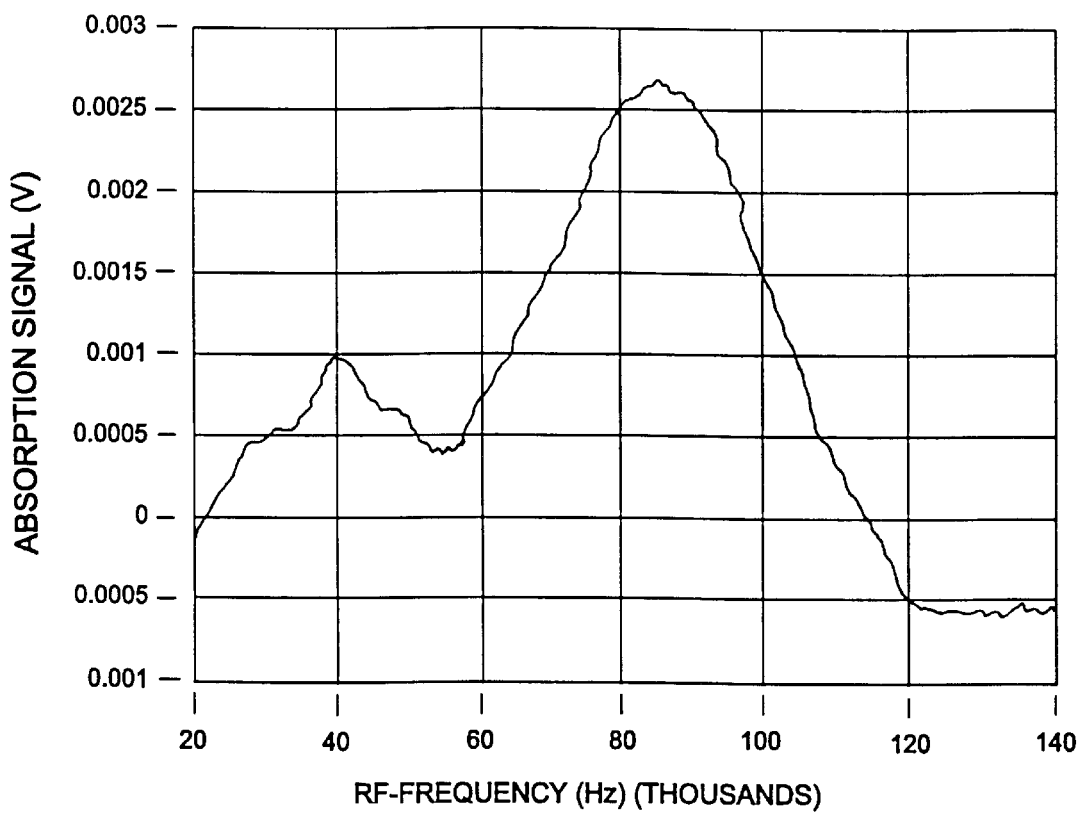
FIG. 5 is a chart of diode laser absorption by Rb as a function of the rf frequency.
Figure 6:
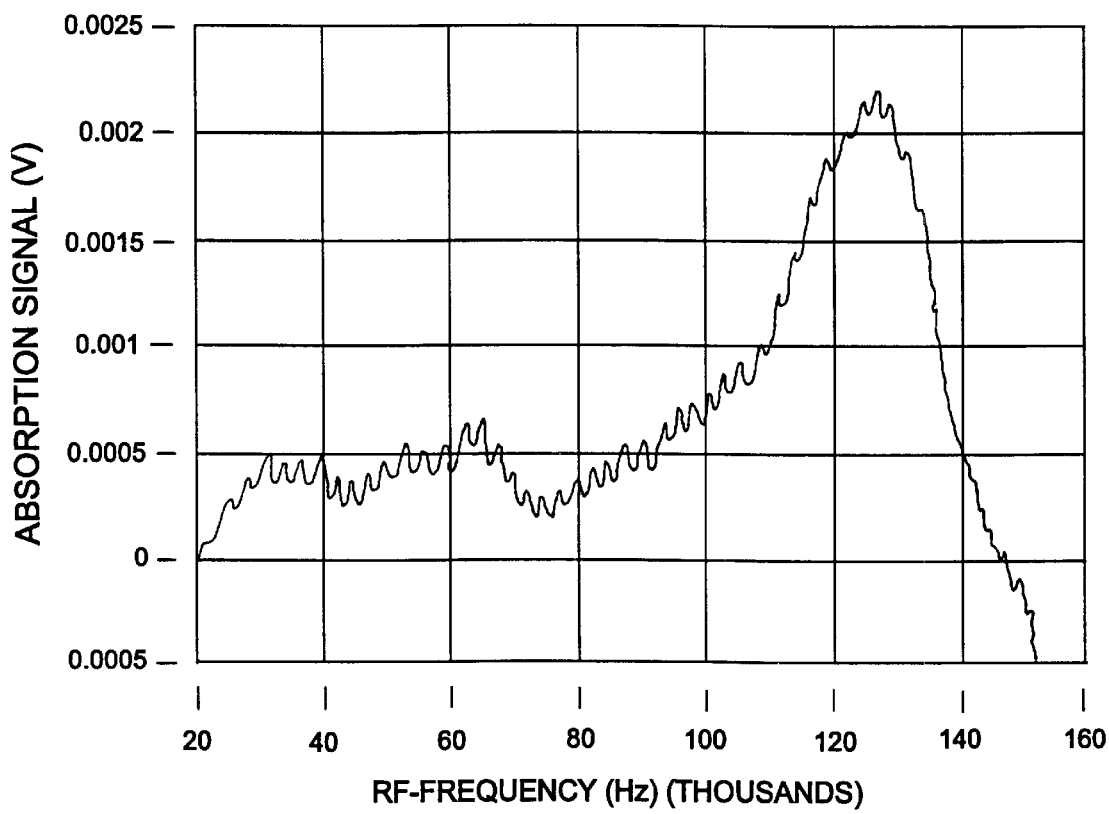
FIG. 6 is a chart of diode laser absorption by Rb as a function of the rf frequency (with screwdriver near Rb cell at 45 deg).
Figure 7:
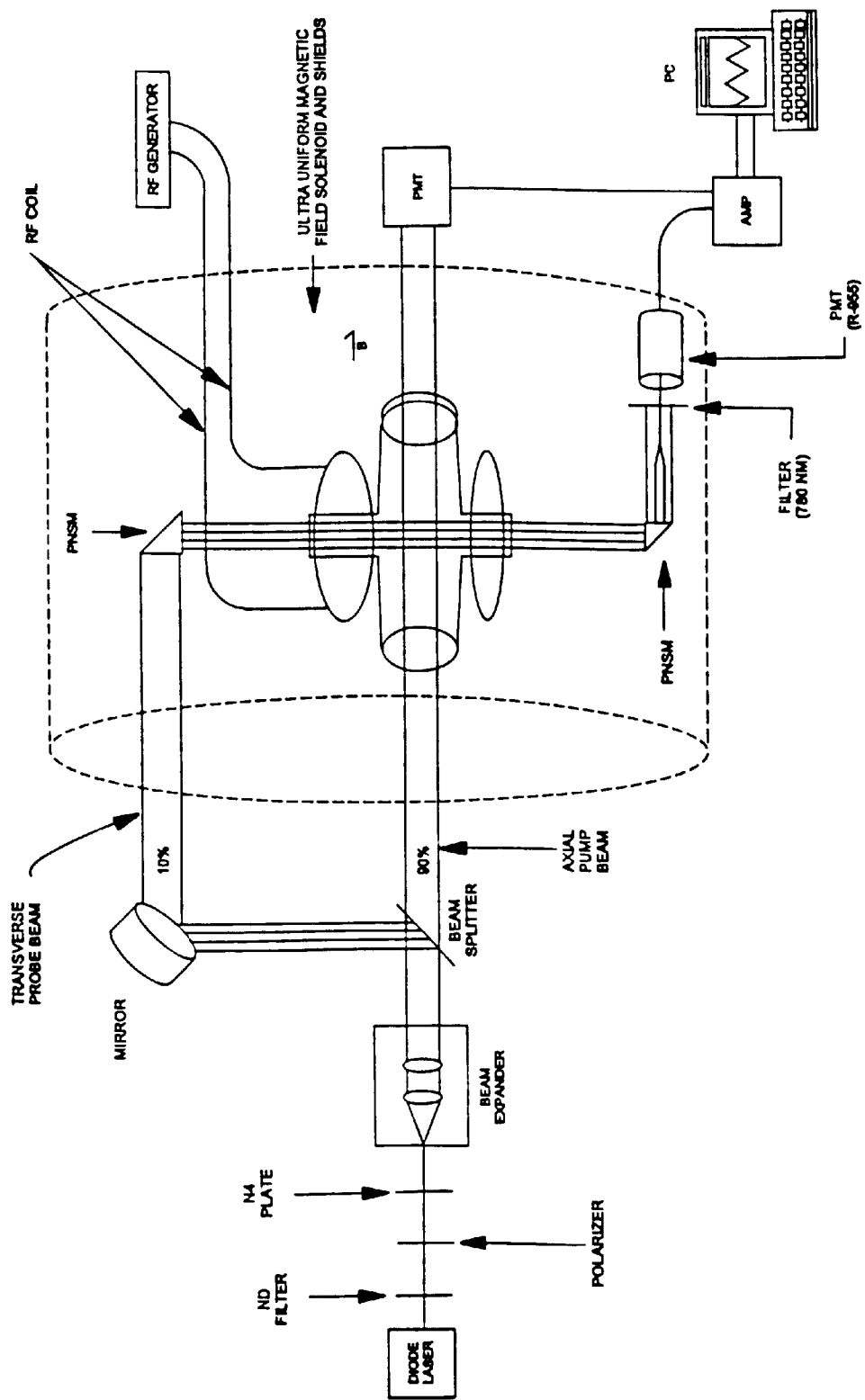
FIG. 7 is a view of the experimental setup at the University of New Hampshire.

In FIG. 5 the rf frequency for the Rb optically pumped cell was scanned from 20 kHz to 140 kHz. An absorption feature is observed at an rf frequency of about 85 kHz. This is far from the anticipated 350 kHz expected for the 0.52 Gauss earth field at Boston's latitude.

This anomaly can be attributed to magnetic field shielding ad permanent magnetism of the metal surface of the optical laser table. A compass placed on the laser table exhibits a variety of deflections as it is moved around, and only by coincidence does it occasionally point toward magnetic north. To demonstrate the agility to observe magnetic influences, a magnetized screwdriver was mounted next to the optical cell.

Accurate magnetometer performance evaluations require a stable and controlled magnetic environment. The broad rf resonances observed on the laser table at PSI clearly demonstrated this need. Indeed, magnetometer evaluations outside a highly uniform shielded and controlled field are difficult. Pencils, pens, nails in shoes, laboratory tools affect the rf magnetic resonance and can be misinterpreted as poor sensitivity, poor stability, broad linewidths, etc. Our ability to perform tests within a well characterized and uniform magnetic field were critical for the magnetometer evaluations described below.

The ultra-precision magnetic solenoid at UNH provided a magnetic field uniformity of better than a few parts in $10^5$. The solenoid-shield system, theory and apparatus, is described in detail in the literature. The solenoid is 36 in. long and 12 in. in diameter. It is constructed with a primary coil and a secondary correction coil. The solenoid is surrounded by two concentric cylindrical Mollypermalloy shields. The solenoid is powered by a regulated current supply with a stability of less than $10^{-6}$. The current supply/solenoid combination produces a uniform field of 20 Gauss amp$^{-1}$ over a spherical diameter of 8 cm. The smallest controlled current change of 1 $\mu$A produces a filed change of 2 nT (2 gamma).

Figure 8:
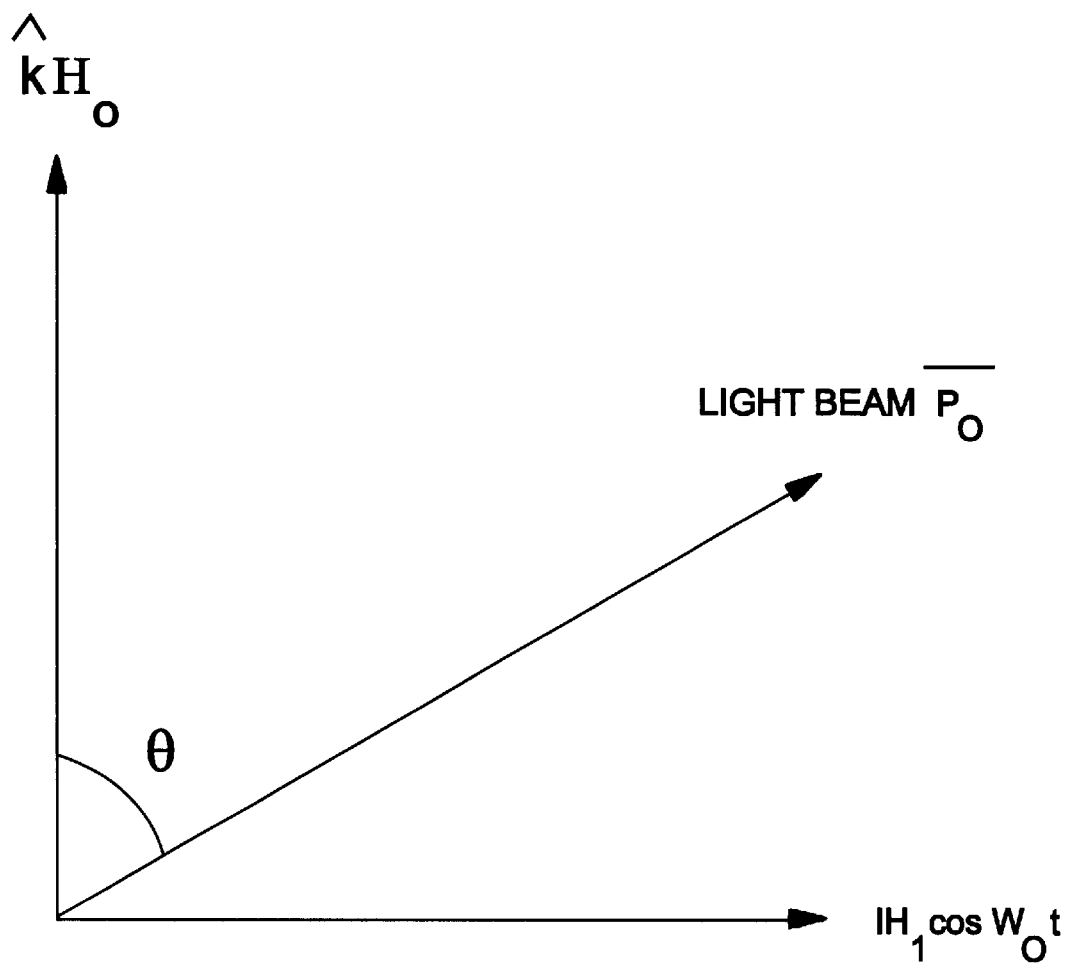
FIG. 8 is the optical pumping vector diagram for self-oscillating magnetometer.

The experimental apparatus at UNH is pictured in FIG. 8. A small firebrick oven was constructed within the solenoid. This oven, 3×5×7 in., contained an alkali vapor cell described previously. The cell was mounted on Fiberfrax® insulation, and enclosed with Pyrex windows on each end of the oven. The oven was heated resistively with a coil of nichrome wire, and the temperature was monitored with a Chromel-Alumel thermocouple. A pair of Helmholtz coils 15 cm in diameter, one above and one below, centered on the oven/optical pumping cell, and provided the rf field for magnetic resonance studies. The Helmholtz coils were powered by a General Radio frequency synthesizer combined with variable resistance attenuators. RF magnetic fields ranging from fractions of a milliGauss to several milliGauss were generated with these coils and power supplies. An HP audio oscillator and mercury relay could be used to modulate the amplitude of the RF output at 9 Hz.

Self-oscillating magnetometers measure the Larmor frequency directly. Light modulation due to self-oscillation of the magnetometer can be explained in terms of modulations of polarized alkali magnetic moments. The spontaneous behavior of self-oscillation parallels maser and laser initiation processes. The self-oscillating magnetometer depends on three basic aspects of optical pumping.

1. Circularly polarized optical-pumping light produces an initial polarization of the alkali atom's magnetic moments in the direction of the pump beam.
2. Changes in the polarization vector's component along the pump beam result in a proportional change in the intensity of pumping light transmitted by the alkali atoms in the pumping cell.
3. If the atoms are in a magnetic field, $H_0^z$, an RF fielde oscillating at the atom's spin resonance frequency ($\omega_L$) will cause the polarization vector to coherently precess about $H_0^z$ (see FIG. 8).

The pump beam produces a polarization $P_0^z$ at an angle $\theta$ to the magnetic field $H_0\hat{k}$. The effective polarization along $\vec{H}$ is therefore $$P_z = P_0 \cos \theta.$$

One can show that if a field $H_1^z \cos \omega_o t$ is applied at the spin-resonance frequency, it produces a precession of the polarization vector about $H_0\hat{k}$. As a result of the precession, the x-component of the polarization, $P_x$, oscillates simultaneously as $$P_x = -P_z \sin \omega_L t = -P_0 \cos \theta \sin \omega_L t.$$

The component of $P_x$ along the pump beam is $P_x \sin \theta$ and this produces an oscillation in the intensity of the light transmitted by the pumping cell:

$$\delta I = -\delta P_{x\alpha} P_0 \cos \theta \sin \theta \sin \omega_L t.$$

Thus the intensity of the pump/probe beam is modulated at $\omega_L$, the Larmor frequency.

Figure 10:
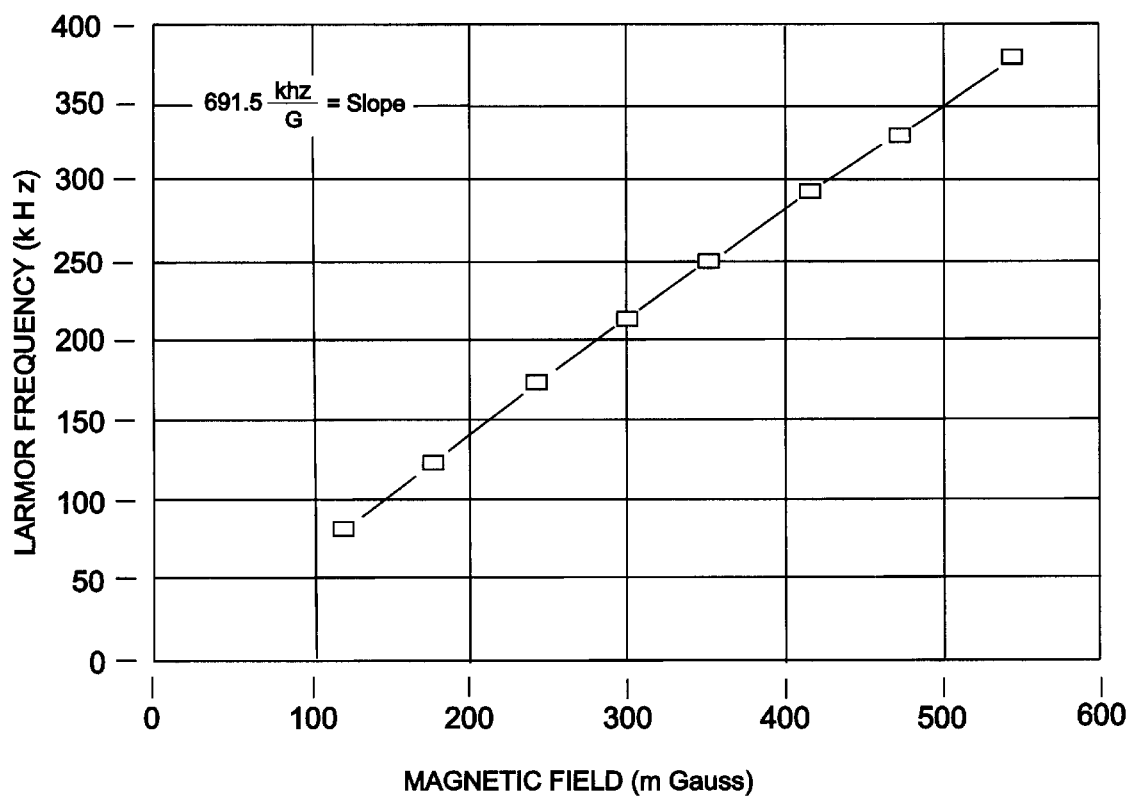
FIG. 10 is a chart of Larmor frequency of self-oscillating K magnetometer using a variable solenoid static field.
Figure 11:
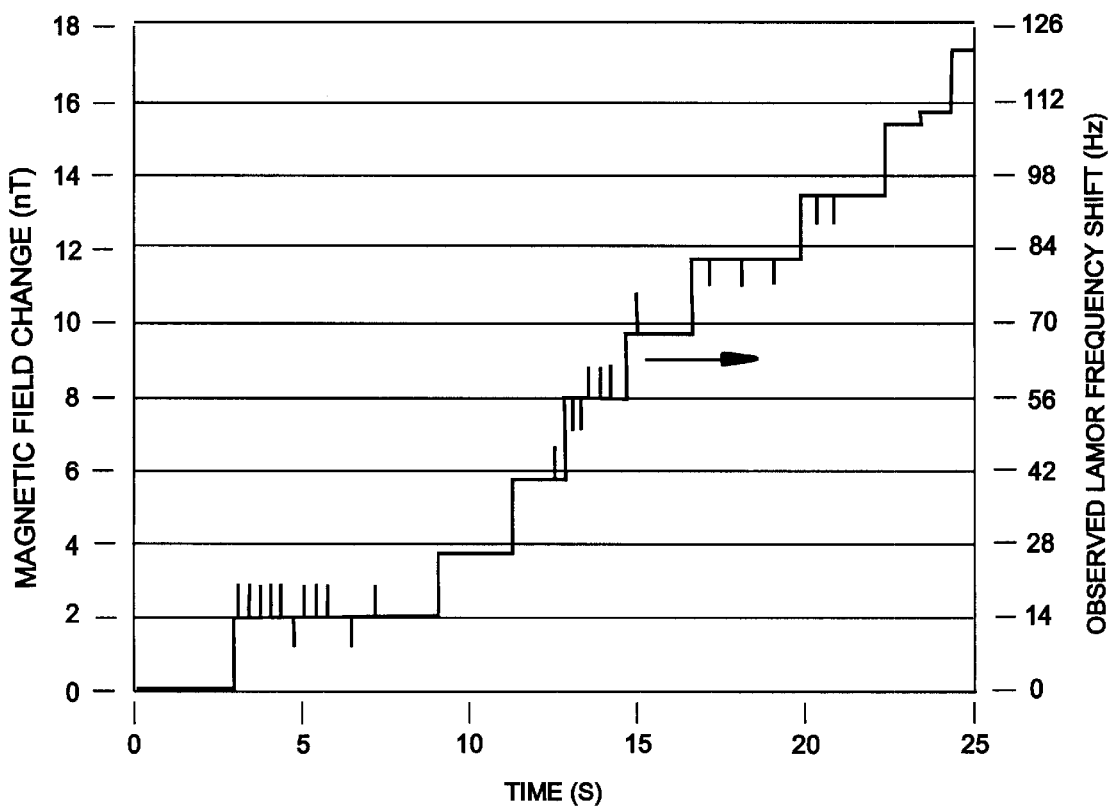
FIG. 11 is a chart of the response of self-oscillating K magnetometer to programmed changes in magnetic field.

The experimental setup for these measurements is shown in FIG. 10. In this case the rf coils are aligned with the laser beam/polarization vector. Angulation of the polarization vector with respect to the static magnetic field vector allowed the laser to act as both the polarization and probe beam simultaneously. The signal was amplified with a Stanford Research Systems Model 1201 low noise preamplifier. The resulting sine wave is counted to determine the Larmor frequency. The same sine wave is phase shifted with an EMC phase shifter, then amplified with a 1 Watt rf amplifier and fed back to the rf coils. When the gain in the feedback amplification components overcomes losses in the optical cell, the system spontaneously locks its oscillation frequency at the Larmor frequency. We found the self-oscillating magnetometer extremely stable and robust. Phase shifts caused changes in the oscillation frequency, but could be accurately established when detector and rf amplifier gains were reduced to avoid linewidth broadening. Larmor frequency measurements were performed at may field strengths, shown in FIG. 11. The least squares slope of the curve is 691.5 kHz/G±0.2%. This matches very well with the accepted value of 699.4 kHz/G. The slight discrepancy is most likely due to the fact that we only counted 10 to 20 cycles of the signals that ranged from 70 kHz to 500 kHz.

Figure 9:
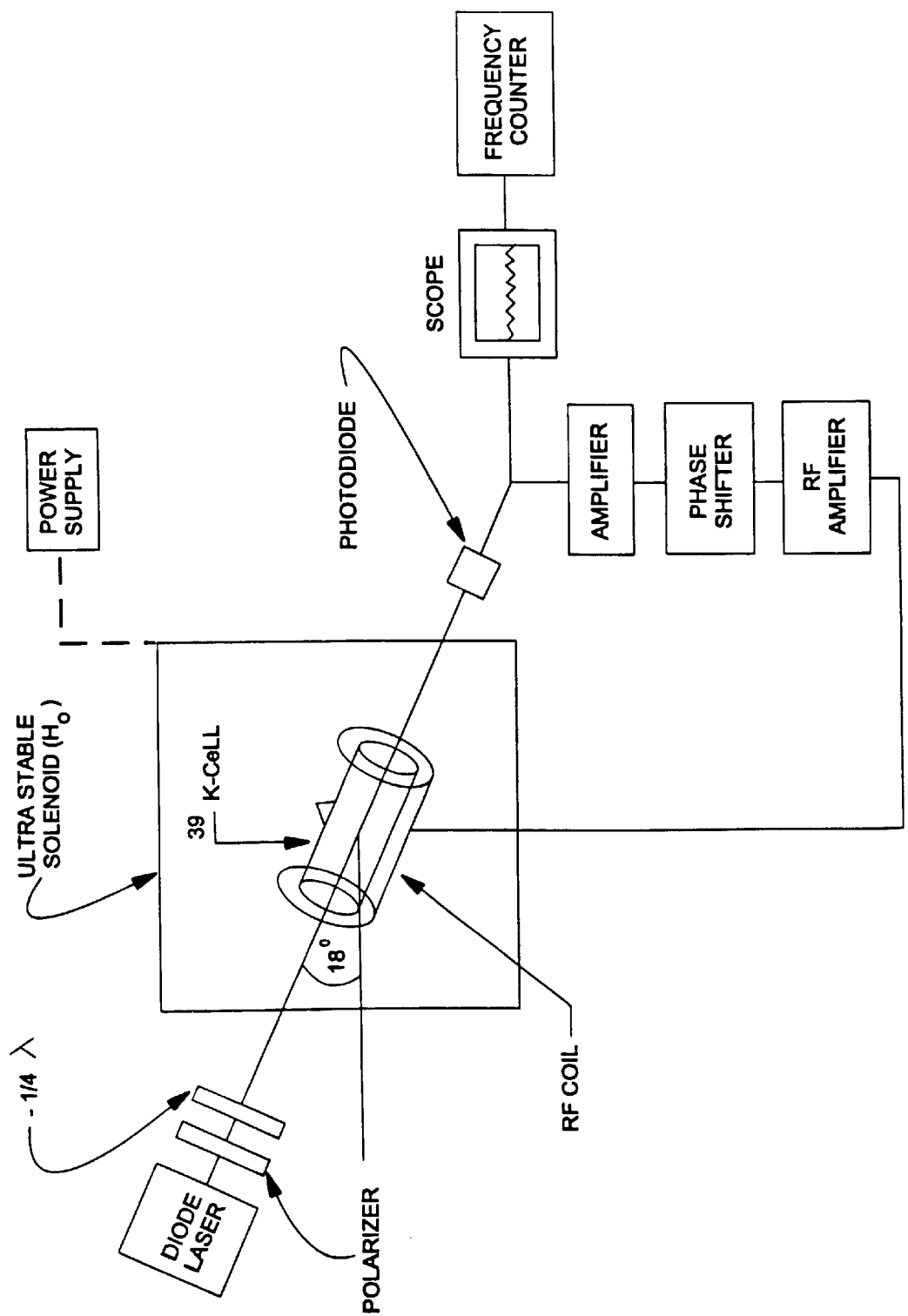
FIG. 9 is an illustration of the diode laser-pumped self-oscillating magnetometer.

The short term stability of the magnetometer was determined by observing frequency drifts in the self oscillating magnetometer recorded on the HP frequency counter. In general, drifts of less than 2 to 3 Hz per each 1 second counting cycle were observed. For the magnetic field being measured (0.5)G this represents a short term stability of less than 0.5 nT. This is very encouraging for an unoptimized system. In FIG. 9 we illustrated the magnetometer's response to programmed changes in the magnetic field. This changes were made by varying the current to the solenoid in integral steps of 1 µA. Each step corresponded to a 2 nT change. The magnetometer easily measured these changes as indicated in the FIG. 10.

Alignment of the magnetometer with the static magnetic field influences the performance of the magnetometer. Several literature references indicate that traditional alkali magnetometers experience a "dead" zone when the optical pumping axis is aligned within 10 deg with the magnetic field. Modern magnetometers are often equipped with multiple sensor heads rotated at 45 deg to avoid a "dead" zone. Tests with the diode laser self-oscillating magnetometer exhibited stable accurate performance to within about 1.5 deg of the magnetic field vector. We speculate the reduced "dead" zone that we observed, i.e., the increased performance, is related to the small laser divergence compared with the larger divergence of an optical lamp. The diode laser magnetometer appears to have a distinct advantage of a smaller dead zone.

Figure 12:
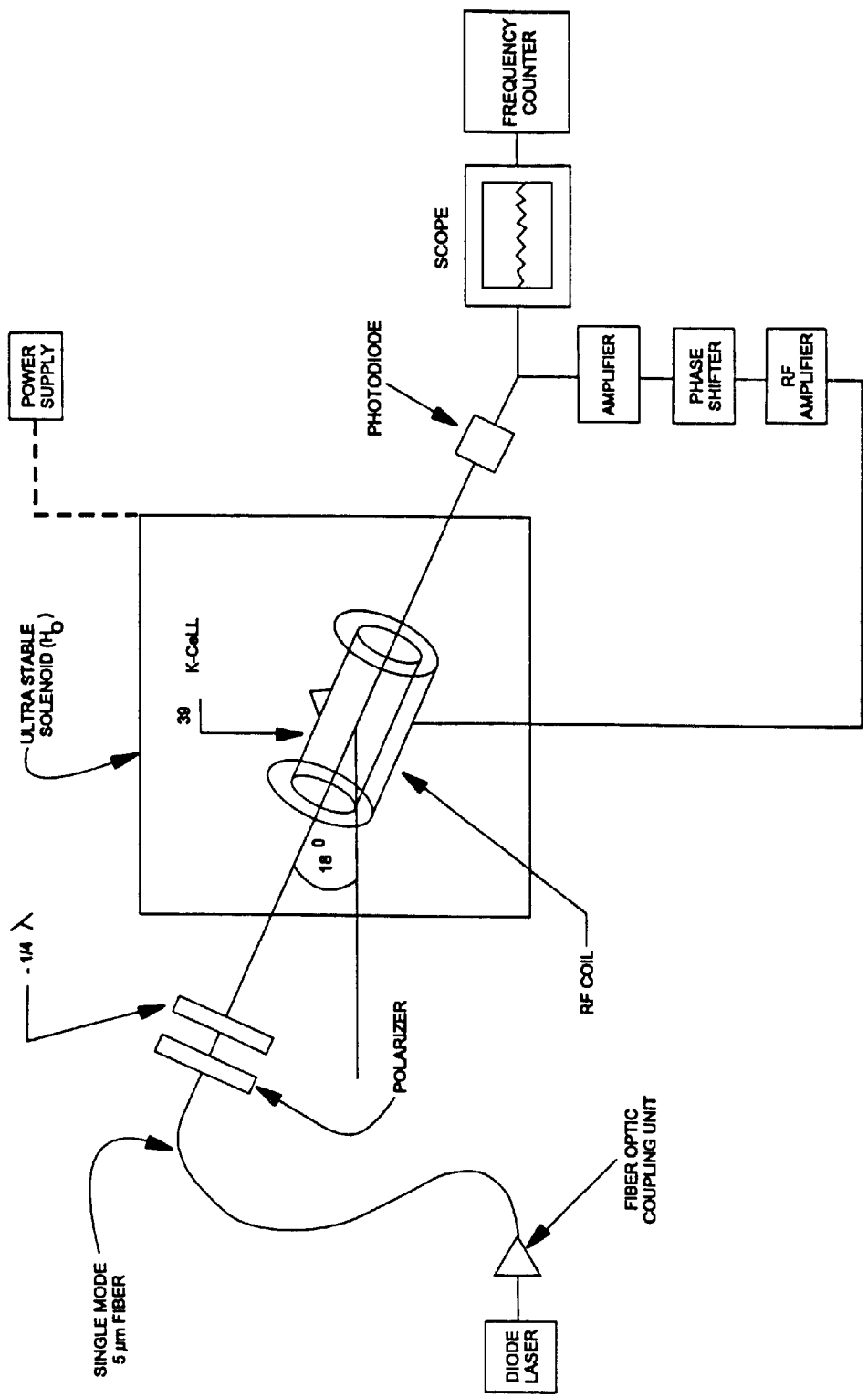
FIG. 12 illustrates the fiber coupled diode laser self-oscillating magnetometer.

A self-oscillating magnetometer utilizing a fiber coupled diode laser light source was also demonstrated in the laboratory at UNH. The laser beam and fiber coupled laser beam systems performed identically. The fiber coupled system is shown schematically in FIG. 12. Fiber coupling inherently provides flexibility that is not available with resonance lamp systems and supports advanced system development for commercial and military applications.

All our results demonstrate that it is feasible to develop a diode laser/fiber optic magnetometer. Even passively stabilized diode lasers are sufficiently stable to optically pump magnetometers for long periods of time without significant wavelength or intensity jitter. Experiments showed that with careful selection of the laser power level, and rf magnetic field sensor, the Zeeman linewidths can be made very narrow, <200 Hz. Standard projections suggest a sensitivity of ~6 pT. Testing with magnetic field alignment indicates the diode laser magnetometer has a smaller "dead" zone than existing lamp pumped magnetometers. Vibration tolerance of the diode laser magnetometer needs further improvement, but the path to monolithic coupled fiber optics is clear and well within the state of practice of the fiber optic-diode laser industry. The diode laser/fiber optic magnetometers possesses characteristics that make them extremely convenient for low power, small size, rugged, multiple sensor head packaging.

In addition, the diode laser has the advantage that it can pump multiple optical cells via fiber optics, whereas lamp pumped units require multiple lamps, multiple lamp power supplies, multiple filters and multiple polarizers.

Our Phase I program has clearly demonstrated the feasibility of three different devices: longitudinal, transverse and self-oscillating magnetometers pumped by fiber-coupled diode lasers. This effort using an unoptimized bench-top magnetometer demonstrated magnetic resolution of better than 1 nT. The bench-top instrument projected sensitivity of less than 6 pT/√Hz is competitive with state of the art commercial Cs vapor magnetometers. The self-oscillating magnetometer exhibited a dead zone of about 1.5 deg compared with about 10 deg for commercial instruments utilizing resonance lamps. Our Phase I results suggest that diode laser magnetometers will exceed the performance of resonance lamp systems. The total scalar field measurement with the diode laser magnetometer is tolerant to vehicle vibration, motion, pitch, yaw, roll and flight path making it superior to instruments such as SQUIDS that measure a component of the field flux. In addition, the diode laser fiber coupled magnetometer allows flexibility in packaging and system distribution that is impossible for resonance lamp systems or SQUID devices required cryogenic cooling. The very small angular dead zone that we observed using diode laser pumping is also a distinct advantage.

The Phase I feasibility study was extremely successful. Diode laser coupling and magnetometer behavior was demonstrated on three different alkali vapors, Rb, K, and K. Three different magnetometer arrangements were successfully demonstrated, $M_z$ (longitudinal), $M_x$ (transverse), and the self-oscillation. Better optical pumping performance was identified at higher buffer gas pressure. Phase I experiments demonstrated considerable tolerance of the magnetometer performance to absorption cell temperature, and magnetic field alignment. Phase I experiments provided valuable insights to RF and laser power broadening of the Zeeman resonance that must be avoided to obtain the maximum system sensitivity. Knowledge and techniques for critical sensitivity measurements and sensitivity projections were developed. The Phase I experiments provided valuable insight to optical isolation requirements for fiber coupled magnetometers. Valuable lessons and insights were identified for Larmor frequency detection and high speed frequency to voltage conversion. The Phase I results have identified critical specifications for an advance bench-top magnetometer. The diode laser pumped magnetometer offers some distinct advantages that will be exploited in numerous military and commercial applications.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A diode laser-pumped magnetometer comprising:
   a diode laser that emits a pumping laser beam with resonant optical radiation;
   a K-cell through which a magnetic field is manifested from an independent source, said K-cell containing atoms with a dipole experiencing a torque due to the magnetic field, said atoms being excited by the resonant optical radiation of the pumping laser beam and periodically emitting a response radiation as they return to ground state such that the response radiation includes photons that indicate one unit of angular momentum indicative of the torque due to the magnetic field; and
   a means for measuring the response radiation of the K-cell to indicate thereby a measure of the magnetic field in the K-cell from the independent magnetic source.

2. A diode laser-pumped magnetometer as defined in claim 1, wherein said measuring means comprises:
   a photodiode which receives and converts the response radiation of the atoms in the K-cell into an equivalent electrical signal; and
   a measuring scope that measures the equivalent electrical signal from the photodiode to produce thereby a measurement indicative of the magnetic field in the K-cell.

3. A diode laser-pumped magnetometer, as defined in claim 2, further comprising:
   a single mode optical fiber which conducts the pumping laser beam from the diode laser to the K-cell; and
   an optical polarizer element which polarizes the pumping laser beam from the single mode optical fiber before it reaches the K-cell.

* * * * *